US007182976B2

(12) United States Patent
Takahashi et al.

(10) Patent No.: US 7,182,976 B2
(45) Date of Patent: Feb. 27, 2007

(54) PROCESS FOR FORMING A THIN FILM AND APPARATUS THEREFOR

(75) Inventors: Yukihiro Takahashi, Shinjyuku-ku (JP); Takeshi Mitsuishi, Shinjyuku-ku (JP); Kenichi Shinde, Shinjyuku-ku (JP)

(73) Assignee: Hoya Corporation, Tokyo (JP)

( * ) Notice: Subject to any disclaimer, the term of this patent is extended or adjusted under 35 U.S.C. 154(b) by 60 days.

(21) Appl. No.: 10/330,131

(22) Filed: Dec. 30, 2002

(65) Prior Publication Data

US 2003/0133124 A1    Jul. 17, 2003

(30) Foreign Application Priority Data

Dec. 28, 2001   (JP)   ............................. 2001-401267

(51) Int. Cl.
*B05D 5/06* (2006.01)
(52) U.S. Cl. .................. 427/164; 427/10; 427/585; 427/596; 427/166; 427/255.7; 118/664; 118/665; 118/723 EB; 118/726; 351/159; 351/166; 351/177; 351/580; 351/581; 351/582; 351/586
(58) Field of Classification Search ............... 427/10, 427/585, 596, 162, 164, 166, 255.7; 118/664, 118/665, 723 EB, 726; 351/159, 166, 177; 359/580, 581, 582, 586
See application file for complete search history.

(56) References Cited

U.S. PATENT DOCUMENTS

| | | | | |
|---|---|---|---|---|
| 2,472,605 A | * | 6/1949 | McRae et al. ................. 427/10 |
| 2,771,055 A | * | 11/1956 | Kelly et al. .................. 118/712 |
| 3,892,490 A | * | 7/1975 | Uetsuki et al. .............. 356/388 |
| 4,024,291 A | * | 5/1977 | Wilmanns ..................... 427/10 |
| 4,140,078 A | * | 2/1979 | Wilmanns ................... 118/665 |
| 4,837,044 A | * | 6/1989 | Murarka et al. ............... 427/10 |
| 4,999,509 A | * | 3/1991 | Wada et al. ........... 250/559.27 |
| 5,000,575 A | | 3/1991 | Southwell et al. |
| 5,009,485 A | * | 4/1991 | Hall ........................... 359/586 |
| 5,354,575 A | * | 10/1994 | Dagenais et al. ............. 427/10 |
| 5,425,964 A | | 6/1995 | Southwell et al. |

(Continued)

FOREIGN PATENT DOCUMENTS

EP    0408015 A    1/1991

(Continued)

OTHER PUBLICATIONS

European Search Report, completed Apr. 21, 2004.

*Primary Examiner*—Alain L. Bashore
(74) *Attorney, Agent, or Firm*—Griffin & Szipl, P.C.

(57) ABSTRACT

A process for forming a thin film is described that enables automatic formation of thin films having constant optical properties reliably and in large quantities with excellent reproducibility suitable for mass production. An apparatus for performing the process is also described. Generally, a material for vapor deposition is vaporized by an electron gun and an antireflection film forms by vapor deposition on lenses held by a coat dome. The electric power applied to the electron gun is controlled so that the amount of transmitted or reflected light continuously measured by an optical film thickness meter during thin film formation is compared to a reference amount of measured light stored in a means for storing data until the measured and reference amounts of measured light are close to, or the same as, one another.

9 Claims, 7 Drawing Sheets

U.S. PATENT DOCUMENTS

| | | | |
|---|---|---|---|
| 5,980,975 A | * 11/1999 | Nomura et al. | 427/10 |
| 2002/0027665 A1 | * 3/2002 | Abe et al. | 356/630 |
| 2003/0086097 A1 | * 5/2003 | Finarov | 356/630 |

FOREIGN PATENT DOCUMENTS

| | | |
|---|---|---|
| EP | 1 094 344 A2 | 4/2001 |
| EP | 1094344 A | 4/2001 |
| JP | 2001-115260 | 4/2001 |
| JP | 2001-123269 | 5/2001 |

* cited by examiner

FIG. 6

| CENTRAL WAVELENGTH OF FILTER (nm) | EXTENSION AMOUNT (%) | REFRACTIVE INDEX |
|---|---|---|
| 396 | 54.44 | 2.2493 |
| 417 | 54.66 | 2.2473 |
| 429 | 52.39 | 2.2150 |
| 453 | 50.60 | 2.1873 |
| 486 | 50.35 | 2.1774 |
| 500 | 49.46 | 2.1635 |
| 543 | 48.60 | 2.1450 |
| 544 | 48.78 | 2.1472 |
| 551 | 48.66 | 2.1444 |
| 571 | 48.50 | 2.1392 |
| 588 | 47.52 | 2.1243 |
| 599 | 47.10 | 2.1175 |
| 599 | 47.15 | 2.1181 |
| 599 | 47.16 | 2.1182 |
| 599 | 47.75 | 2.1253 |

PROCESS FOR FORMING A THIN FILM AND APPARATUS THEREFOR

FIELD OF THE INVENTION

The present invention relates to a process for forming a thin film on the surface of a material, such as plastics or glass, and an apparatus for practicing the process. More particularly, the present invention pertains to a process for rapidly forming a thin film that has constant optical properties with excellent reproducibility during large scale manufacturing. The process in accordance with the present invention is advantageously applied for forming an antireflection film on a spectacle lens and the apparatus in accordance with the present invention provides a machine for performing the process.

BACKGROUND OF THE INVENTION

Processes for forming a thin film on an article, such as a spectacle lens, are well known. Thin films having a uniform distribution of optical properties can be automatically produced in large quantities with excellent stability and reproducibility by controlling the amount of the film-forming material "in flight" (i.e., vaporized) during production. The amount of film forming material in flight during production is controlled by comparing a specific measured optical parameter value, which depends uniquely on the optical film thickness, to a predetermined reference value for the measurement. During thin film formation, the measured parameter's value changes continuously during the process of thin film formation and the system or apparatus for forming the thin film makes adjustments until the measured parameter value agrees with the reference value for the measurement.

For example, as disclosed in Japanese Patent Application Laid-Open No. 2001-115260, a process for forming a thin film utilizes the light transmission and reflection characteristics of an article having a thin film formed thereon. When an article having a thin film formed thereon is irradiated with prescribed light, the amount of light transmitted through, or reflected from, the thin film depends on the refractive index and the thickness of the thin film. Using these optical properties of thin films, an optical film thickness meter is used for measuring the amount of light transmitted by, or reflected from, the thin film. Subsequently, the system for forming the thin film is operated to continuously control the amount of film-forming material in flight until the amount of transmitted light or reflected light measured by the optical film thickness meter is close to, or the same as, a reference amount of light corresponding to the desired thin film thickness.

As further described in Japanese Patent Application Laid-Open No. 2001-115260, there is a problem obtaining exactly the amount of reference light corresponding to the desired thin film thickness. Specifically, the reference amount of light may be maintained by supplying a constant electric power to the electric gun that generates the reference light, which occurs when various operating conditions of the apparatus are optimal. However, more frequently than not, various operating conditions for the system are not optimal and the apparatus for forming the thin film must be controlled using the experience and the intuition of a skilled operator. This makes control of the thin film formation process complicated.

For example, when forming an antireflection film on a spectacle lens for commercial applications, it is often necessary that both the antireflection property and the color of light reflected from the antireflection film be taken into consideration because some customer's want colored spectacles from the standpoint of fashion. To provide specifically colored spectacle lens having an antireflection film formed thereon, a specific process is performed. First, the desired color is set at a wavelength selected by an engineer who sets the interference color. Second, the film is actually formed at the set wavelength and the color of the reflected light is confirmed by the naked eyes. When correction in the color of the reflected light is necessary, the wavelength selected, (i.e., the filter set at the optical film thickness meter), is changed and the above process is laboriously conducted again. This process of forming the antireflection film is repeated until the desired color of the reflected light is achieved. In this case where the process of forming the antireflection film is repeated until the desired color of reflected light is achieved, it is necessary to collect data on the amount of reference light present when the desired color of the reflected light is selected. Thus, markedly complicated trial-and-error operations must be repeated to provide guidance or constructive feedback with respect to achieving the desired color of reflected light during the process of forming a thin film.

Moreover, the types of commercially provided antireflection films are numerous. Since the set or selected wavelengths for these antireflection films are different from each other in many cases, the filters in the optical film thickness meters are frequently different from each other as well. Consequently, this leads to having different apparatuses for forming a thin film in a production line. When a specific antireflection film is formed in all apparatuses for forming a thin film in the production line, the possibility exists that complicated operations must be conducted for actually measuring data of the reference amount of light best suited to the filter in each optical film thickness meter.

The present invention endeavors to overcome the above problems and has as an object to provide a process for forming a thin film, wherein when the wavelength corresponding to the thin film previously formed is changed, the data corresponding to the reference amount of light can be easily measured even though the type of the filter in the optical film thickness meter is different among each of the apparatuses for forming a thin film in the production line. Furthermore, the present invention endeavors to provide an apparatus for practicing the process for forming a thin film of the present invention.

SUMMARY OF THE INVENTION

In accordance with the above objectives there is provided a process for forming a thin film. The process comprises the steps of: (A) forming a first thin film by flying and depositing a film-forming material onto a surface of an article and on a monitor glass; (B) continuously measuring a thickness of the first thin film using an optical film thickness meter during formation of the first thin film; and (C) continuously controlling the amount of the film-forming material in flight during the formation of the first thin film until an amount of light measured by the optical film thickness meter becomes close to, or the same as, a predetermined reference amount of measured light, wherein prior to forming the first thin film, the process further comprises the steps of: (D) conducting a test formation of a test thin film, wherein a refractive index of the formed test thin film is determined at a first plurality of wavelengths by using the optical film thickness meter, a reference amount of measured light is calculated at a second plurality of wavelengths from refractive indices corresponding to the first plurality of wavelengths using a theoretical calculation, so that thin film formation forms the first thin film to have a controlled optical thickness at a first predetermined wavelength using the corresponding calculated reference amount of measured light, wherein a) the optical film thickness meter is an optical thickness meter utilizing dependency on an amount of light of prescribed wavelength transmitted through, or reflected by, thin film based upon at least thin film thickness and thin film refractive index and, when the monitor glass on which the first thin film is formed is irradiated with prescribed light, provides a measurement of the thickness of the first thin film by measuring an amount of light transmitted or reflected by the first thin film; b) the optical film thickness meter continuously measures, during the formation of the first thin film, an amount of transmitted or reflected light, or a change in the amount of transmitted or reflected light, which changes with the change in the thickness of the first thin film deposited on the surface of the article; and c) the reference amount of measured light is determined from data collected, being the amount of measured light or the change in the amount of measured light, measured continuously by the optical film thickness meter during test formation of the test thin film.

In a second preferred process embodiment in accordance with the present invention, the process according to the first preferred embodiment is further modified wherein the reference amount of measured light is determined in accordance with a first sub-process characterized by the steps of a) conducting the test formation of the test thin film while the amount of light, or the change in the amount of light, of prescribed wavelength is continuously measured by the optical film thickness meter during test film formation; b) forming a test thin film having a predetermined optical thickness at the prescribed wavelength and determining the refractive index of the formed test thin film at the prescribed wavelength from material constants including the optical thickness and a physical thickness of the test thin film; c) conducting test formation of other test thin films using light of a third plurality of wavelengths that are different from the prescribed wavelength, wherein each one of the other test thin films has the predetermined optical thickness, and a corresponding refractive index for each of the other test thin films at the respective one of the third plurality of wavelengths is determined from material constants including optical thickness and physical thickness of the respective test thin film so that the respective refractive indices of the formed other test thin films are determined at the third plurality of wavelengths; d) generating an equation expressing a relation between wavelength and thin film refractive index from the refractive indices of all test thin films determined at the prescribed wavelength and the third plurality of wavelengths in the test formation of all test thin films and calculating a refractive index at a second preselected wavelength different from all examined wavelengths using the equation; and e) expressing the amount of measured light or the change in the amount of measured light measured continuously during thin film formation using the optical film thickness meter, by a theoretical equation that is a function of measured thin film refractive index, calculating continuously the amount of light or the change in the amount of light of a third wavelength during thin film formation by substituting a corresponding measured refractive index at the third wavelength into the theoretical equation; and using the calculated amount of light or the calculated change in the amount of light as the reference amount of measured light corresponding to the third wavelength.

In a third preferred embodiment in accordance with the present invention, the first process embodiment is further modified wherein the refractive index of the first thin film is calculated using measured values for at least a reflectivity of a monitor glass and a transmission spectrum of a filter of the optical film thickness meter.

In accordance with a fourth preferred process embodiment in accordance with the present invention, the second preferred process embodiment is further modified wherein the refractive index of the first thin film is calculated using measured values for at least a reflectivity of a monitor glass and a transmission spectrum of a filter of the optical film thickness meter.

In accordance with a fifth preferred process embodiment in accordance with the present invention, a process for producing a lens is characterized by the process for forming a thin film in accordance with the first preferred process embodiment utilized as a step, wherein the article is a lens for forming the first thin film thereon.

In accordance with a sixth preferred process embodiment in accordance with the present invention, a process for producing a lens is characterized by the process for forming a thin film in accordance with the second preferred process embodiment utilized as a step, wherein the article is a lens for forming the first thin film thereon.

In accordance with a seventh preferred process embodiment in accordance with the present invention, a process for producing a lens is characterized by the process for forming a thin film in accordance with the third preferred process embodiment utilized as a step, wherein the article is a lens for forming the first thin film thereon.

In accordance with an eighth preferred process embodiment in accordance with the present invention, a process for producing a lens is characterized by the process for forming a thin film in accordance with the fourth preferred process embodiment utilized as a step, wherein the article is a lens for forming the first thin film thereon.

In a first preferred apparatus embodiment in accordance with the present invention, an apparatus for forming a thin film is characterized by: (a) a vacuum chamber; (b) a control unit that includes a computing apparatus; (c) a means for storing data corresponding to a reference amount of measured light at a plurality of wavelengths, wherein the means for storing data is electronically connected to send reference amount of measured light data signals to the control unit; (d) a coat dome disposed inside the vacuum chamber, wherein the coat dome holds at least one lens providing a surface upon which a thin film forms, and the coat dome includes a monitor glass providing a surface upon which a thin film forms; (e) a crucible disposed inside of the vacuum chamber, wherein the crucible holds a vaporizable film-forming material; (f) an electron gun disposed in the vacuum chamber and electronically connected to receive control signals from the control unit, wherein the electron gun is positioned to heat the crucible in response to receiving control signals from the control unit; and (g) an optical film thickness meter disposed to receive either transmitted or reflected light from a thin film when the thin film forms on the monitor glass, wherein the optical film thickness meter is electronically connected to send film thickness data signals to the control unit, wherein the optical film thickness meter is an optical thickness meter utilizing dependency on an amount of light of prescribed wavelength transmitted through, or reflected by, thin film based upon at least thin film thickness and thin film refractive index and, when the monitor glass on which the thin film is formed is irradiated with prescribed light, provides a measurement of the thickness of the thin film by measuring an amount of light transmitted or reflected by the first thin film, the optical film thickness meter continuously measures, during formation of thin film, an amount of transmitted or reflected light, or a change in the amount of transmitted or reflected light, which changes with the change in the thickness of thin film deposited on the monitor glass; and the reference amount of measured light is determined from data collected, being the amount of measured light or the change in the amount of measured light, measured continuously by the optical film thickness meter during test formation of a test thin film, so that the control unit controls the formation of the thin film on the monitor glass by controlling a rate of vaporization of the film-forming material by controlling operation of the electron gun in response to receiving reference amount of measured light data signals and film thickness data signals.

BRIEF DESCRIPTION OF THE DRAWINGS

FIG. 6 is a table describing extension amounts at a plurality of wavelengths and the refractive indices corresponding to the extension amounts.

DETAILED DESCRIPTION OF THE PREFERRED EMBODIMENTS

Figure 1:
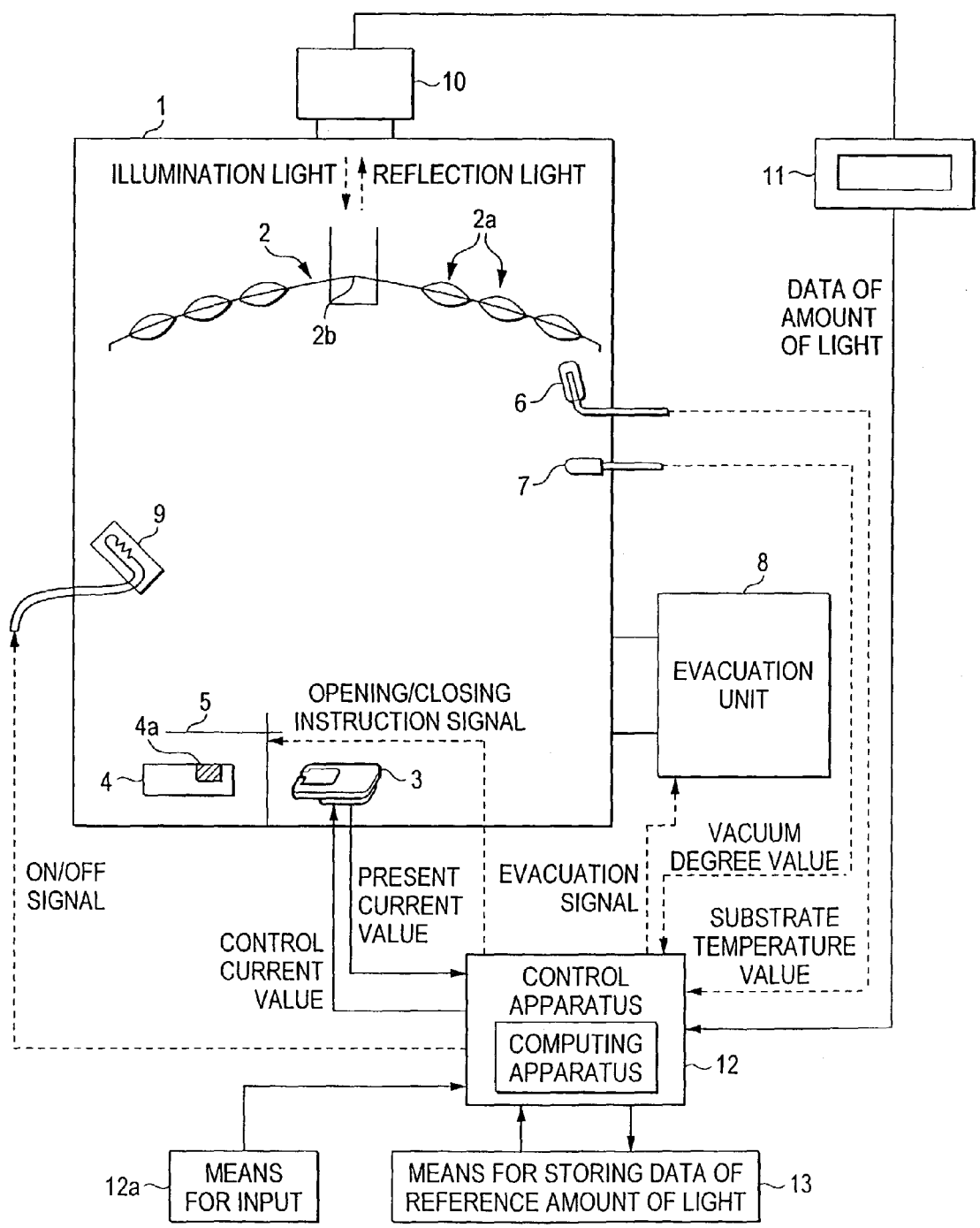
FIG. 1 shows the schematic construction of an apparatus for forming a thin film in accordance with a preferred apparatus embodiment of the present invention.

The present invention includes both apparatuses and methods for forming a thin film on an article, or more specifically, for forming a thin, antireflection film on a lens made of plastic or glass. The apparatus in accordance with the present invention will be described first to facilitate an easy understanding of the method in accordance with the present invention. FIG. 1 schematically illustrates the construction of an apparatus for forming a thin film in accordance with the present invention.

FIG. 1 illustrates that within a vacuum chamber 1, which is the chamber wherein the thin film formation takes place, a coat dome 2 is disposed at an upper portion. An electron gun 3, a crucible 4, and a shutter 5 are disposed at lower portions of the vacuum chamber 1. In the vicinity of the coat dome 2, a thermometer for substrates 6 is disposed for measuring the temperature of lenses 2a. Lenses 2a are the articles upon which the thin film is formed. Lenses 2a are held by the coat dome 2 during the thin film formation process. A vacuum gauge 7 for measuring the degree of vacuum inside the vacuum chamber 1 is disposed inside of the vacuum chamber, and an evacuation unit 8 for evacuating the inside of the vacuum chamber 1, is disposed relative to vacuum chamber 1 so as to be connected to draw a vacuum inside the vacuum chamber. A halogen heater 9 is disposed inside vacuum chamber 1 for heating the lenses 2a held by the coat dome 2.

An optical film thickness meter 10 is disposed at an upper portion outside the vacuum chamber 1. The optical film thickness meter 10 is electronically connected to a control apparatus 12 via a film thickness monitor 11. A means 13 for storing data of the reference amount of (measured) light and a means 12a for input are also electronically connected to the control apparatus 12. The electron gun 3, the shutter 5, the thermometer for a substrate 6, the vacuum gauge 7, the evacuation unit 8 and the halogen heater 9 are all electrically connected to the control apparatus 12. The control apparatus 12 conducts various controls with exchange of information between these various instruments.

The control apparatus 12 controls the evacuation unit 8 based on the vacuum information input from the vacuum gauge 7 to keep the inside of the vacuum chamber 1 at a prescribed degree of vacuum. The control unit 12 also keeps the lenses 2a, which are the articles for forming a film thereon, at a prescribed temperature by controlling the halogen heater based on the temperature information input from the thermometer for substrates 6. The control unit 12 controls the electric power (the electric current and/or the voltage) applied to the electric gun 3 based upon signal input from optical film thickness meter 10 that continuously measures the amount of light reflected by the thin film. The amount of light reflected by the thin film during thin film formation depends on the optical thickness of the thin film formed on a monitor glass 2b. As the rate of formation of the thin film on the monitor glass 2b is the same as the rate of formation of the thin film on the lenses 2a, measurements of light reflected from the monitor glass 2b is used by control unit 12 to determine the control of the rate of formation of the thin film by controlling the operation of electric gun 3. The process of thin film formation is controlled by the control unit 12 as discussed above until the amount of measured reflected light from monitor glass 2b reaches the same value as the selected reference value stored in the means 13 for storing data of a reference amount of (measured) light at the time of the measurement. When this condition is reached, the thin film formed on the lenses 2a is at the desired thickness and control unit 12 stops the process of thin film formation (i.e., discontinues power to the electric gun 3).

The coat dome 2 is a "means for holding" that holds the lenses 2a so that a thin film, such as the antireflection film deposited in accordance with the present invention, is formed by vapor deposition on the lenses 2a, which are the articles for forming a film thereon, or which are the articles upon which the thin film is formed. The coat dome 2 has a round concave shape so that a plurality of lenses 2a can be coated by the vapor deposition technique and the curvature of the coat dome ensures that all lenses are coated with an antireflection film having the same thickness and quality.

The vapor deposition technique is achieved as follows. The electric gun 3 heats a substance 4a (i.e., a raw material) for vapor deposition placed in the crucible 4 at the point of vaporization, or boiling point, of the substance 4a for vapor deposition (the raw material). Heat generated by the electric gun 3 vaporizes the substance 4a thereby creating a vapor of the substance. As the vaporized substance cools, the substance 4a for vapor deposition (the raw material) is vapor deposited and accumulated on the surfaces of lenses 2a and the surface of monitor glass 2b to form thin films on the surfaces of these articles.

The crucible 4 is a conventional container used for holding the substance 4a for vapor deposition. It is preferable that the crucible is cooled in some conventional fashion, or made of a material having great thermal conductivity, so that "bumping" of the substance 4a for vapor deposition is prevented when the substance 4a for vapor deposition is heated by the electron gun 3.

The shutter 5 is opened when the vapor deposition process is started and closed when the vapor deposition process is completed. The shutter 5 facilitates control of the formation of the thin film. The halogen heater 9 is a means for heating which heats the lenses 2a to a suitable temperature so that the thin films formed by vapor deposition on lenses 2a have suitable properties, such as a suitable adhesive property.

The optical film thickness meter 10 utilizes the optical phenomenon of light interference. Specifically, when a transparent substrate having a transparent film formed thereon is irradiated with light, light reflected by the surface of the transparent thin film and light reflected by the surface of the transparent substrate interfere with each other due to the phase difference between light reflected by the different surfaces. The phase difference changes depending on the refractive index and the optical thickness of the thin film; therefore, changes in these two parameters will affect changes in the interference condition. Thus, the total amount of reflected light as reflected by both surfaces changes depending on the refractive index and the optical thickness of the thin film. Naturally, the amount of the transmitted light also changes when the amount of the reflected light changes, so the present invention could also be practiced by conducting measurements utilizing the transmitted light instead of, or in addition to, the measurements of the reflected light without departing from the scope and spirit of the invention. However, using the reflected light is preferable because this allows for the optical film thickness meter to be disposed outside of the vacuum chamber, which is more convenient. The following descriptions of the measurement of thin films are based upon this case where the reflected light is being measured.

Figure 2:
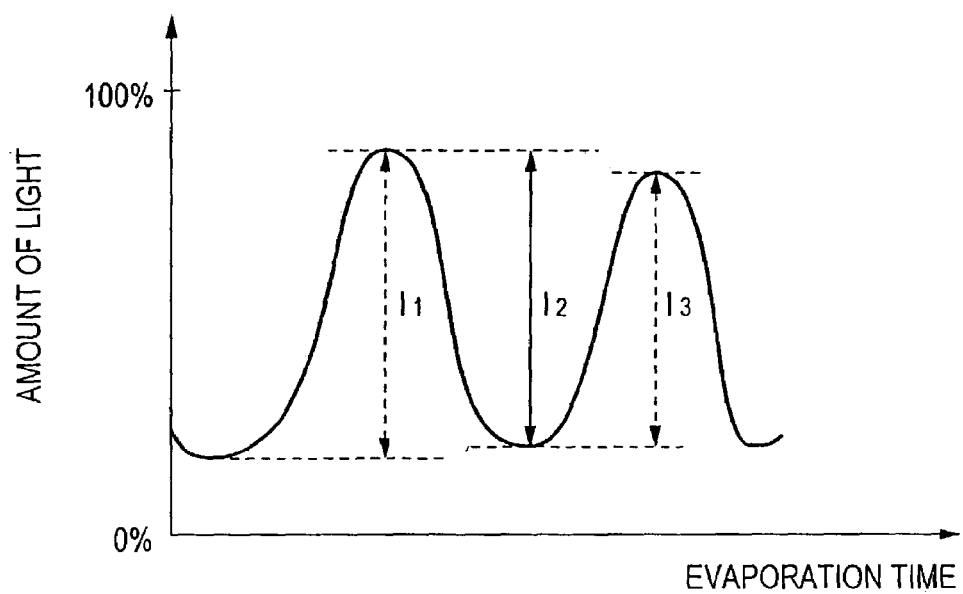
FIG. 2 is a diagram exhibiting the change in the amount of reflected light when a thin film is formed by vapor deposition on the surface of glass.

FIG. 2 illustrates the change in the amount of reflected light over time as a thin film is formed by vapor deposition on the surface of the monitor glass 2b. In the figure, the ordinate represents the amount of light reflected by the thin film and interfering with the light reflected by the surface of the monitor glass 2b (a relative value being the percentage of the total incident light; the units in %) and the abscissa represents the time elapsed (Evaporation time) of the vapor deposition process. As the physical thickness of the thin film formed by the vapor deposition increases, the amount of light reflected by the thin film and interfering with light reflected by the surface of the monitor glass 2b repeats an increase to a successive maximum value followed by a decrease to a successive minimum value in a regular and predictable fashion as the physical thickness increases while the refractive index of the thin film remains constant. For convenience, the amount of light reflected by the thin film and interfering with light reflected by the surface of the monitor glass 2b will be concisely referred to as "the amount of measured light." Thus, the thickness of the thin film can be uniquely measured and/or controlled by knowing and utilizing the refractive index of the thin film and by determining the change in the amount of measured light that uniquely corresponds to the physical thickness of the thin film. As shown in FIG. 2, there is a magnitude difference between the local maximum value and the local minimum value in each time period during the vapor deposition process, and this magnitude difference will be referred to as the "extension amount." In general, successive extension amounts $l_1$, $l_2$, $l_3$ and so on are not going to be identical to each other because, as the thin film gets thicker some of the incident light will be absorbed by the thin film thereby decreasing successive maximums.

Figure 3:
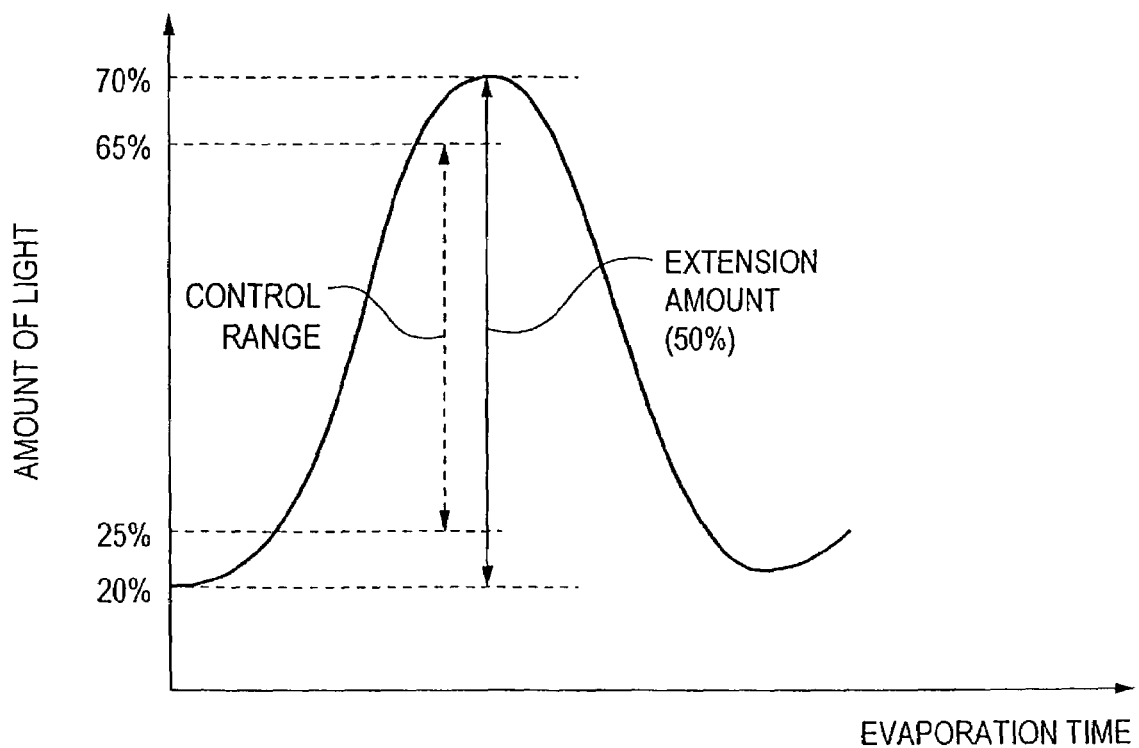
FIG. 3 is a diagram exhibiting the extension amount range used for the control.

The accuracy of control decreases around the maximum values and the minimum values because of the rapid change in the amount of measured light. Therefore, in general, the entire range of the extension amount is not used for control purposes, rather, only a limited portion of the extension amount is used for control purposes. FIG. 3 illustrates the range, or portion, in the extension amount that is used for control purposes. As shown in FIG. 3, for example, when the minimum value of the amount of measured light is 20%, and the maximum value of the amount of measured light is 70% so the useful extension amount is about 50%, the areas or portions of 5% of measured light at the top and the bottom of the curve are excluded. Thus, the area or portion of the amount of measured light in the extension amount limited to from about 25 to 65% is used for the control purpose. In other words, to improve control, only that portion of the extension amount limited to from about 25 to 65% is usable to accurately guide control.

Figure 4:
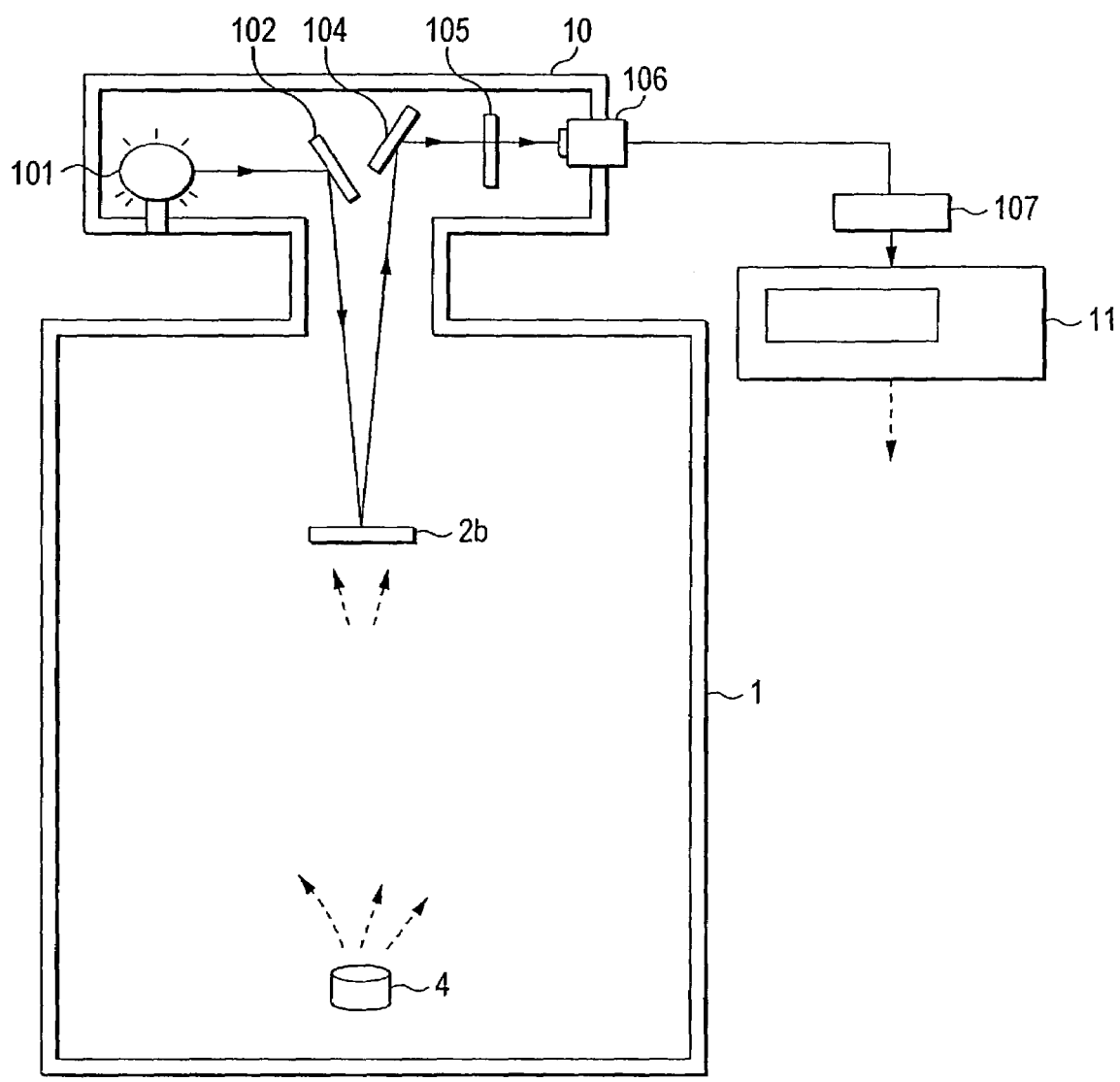
FIG. 4 is a schematic diagram exhibiting the inner structure of the optical film thickness meter.

The structure of the optical film thickness meter is described with reference to FIG. 4. The optical film thickness meter 10 includes the following components: a light-projecting lamp 101, a reflection mirror A 102, a monitor glass 2b, a reflection mirror B 104, a filter 105, a light-receiving sensor 106, a major portion of the film thickness monitor 11 and a pen recorder 107.

As the thickness of the thin film formed on the monitor glass 2b increases, the amount of light reflected by the monitor glass 2b changes and the amount of measured light changes. The light-projecting lamp 101 is the light source necessary for providing light used for measuring the change in the amount of measured light as the thin film forms. The light projected by the light-projecting lamp has a spectrum of intensity of radiation. Therefore, to obtain an accurate measurement of the amount of measured light, the spectrum of intensity of radiation should be analyzed with respect to the wavelength by a spectrometer. When the spectrum of intensity of radiation is continuous and does not show great changes with respect to the different wavelengths, then the amount of light measured by the optical film thickness meter corresponds to a relative intensity of light, as described later. In this case, the amount of light can be measured by the optical film thickness meter without the need to analyze the spectrum of intensity of radiation with respect to the wavelength. Therefore, it is preferable that light projecting lamp 101 be a light source that generates light having a spectrum of intensity that is independent of, or relatively independent of the wavelength of the light.

The reflection mirror 102 is used essentially for reflecting the incident light projected by the light-projecting lamp 101 to direct the reflected incident light to the monitor glass 2b. The degree of reflection of the reflection mirror 102 is not particularly limited. To simplify the calculation of the amount of light measured, it is preferable that the entire amount of the incident light projected from the light-projecting lamp 101 be reflected by reflection mirror 102.

The monitor glass 2b is disposed at a position so that a film is formed on the lower surface of the monitor glass as the substance of vapor deposition is vapor deposited on the monitor glass. When the film of the substance of vapor deposition (also referred to as the "substance film") is formed on the lower surface of the monitor glass 2b, the amount of the light that has been reflected by both the reflection mirror A 102 and by the monitor glass changes as the thickness of the formed thin substance film increases. The amount of measured light thus obtained depends upon these changes in the amount of the reflected light as the thickness of the thin substance film increases. It is preferable that the monitor glass 2b has a thickness such that the possibility of the interference from the monitor glass's own surfaces can be minimized or excluded. The material of the monitor glass is not particularly limited. Glass materials having known refractive indices are preferable and glass materials comprising silicon dioxide are most preferred.

The refractive index of the monitor glass can be measured using a spectrometer. It is preferable to conduct this measurement in a vacuum since the monitor glass is, in general, disposed inside the vacuum chamber 1 of vapor deposition apparatus in a vacuum. However, since the difference in the refractive indices of the monitor glass 2b measured in a vacuum and measured in a normal atmospheric environment does not significantly affect the value of the amount of measured light obtained by measurement using optical film thickness meter 10, it is possible to measure the refractive index of the monitor glass in a non-vacuum atmospheric environment without significantly affecting the "amount of light" measurements. In this context, the phrase "amount of light" means the intensity of light, or the magnitude of the intensity of the light, that is being measured.

The reflection mirror B 104 is disposed to reflect light coming from monitor glass 2b into the direction of the light-receiving sensor 106. It is preferable that the reflection mirror B 104 is similar in type to reflection mirror A 102 so that reflection mirror B reflects the entire amount of the incident light in a manner similar to how the reflection mirror A 102 reflects incident light.

The filter 105 selectively transmits light having a prescribed range of wavelengths so that only a selected range of wavelengths in the spectrum of the incident light coming from the reflection mirror B 104 is transmitted. In general, a desired filter can be selected among various filters. In a manufacturing plant producing many different types of antireflection films in large quantities, many individual vapor deposition apparatuses are installed. For each particular type of antireflection film, a filter suited to transmit the wavelengths specifically corresponding to the designed wavelengths of the antireflection film to be formed is attached as filter 105 to the respective vapor deposition apparatus. In other words, the filters 105 attached to the individual vapor deposition apparatuses installed in a large manufacturing plant are frequently different from each other when the plant produces many different types of antireflection films in large quantities.

The filter 105 has a characteristic transmission spectrum depending upon which type of filter is selected and used in the present invention. In other words, the transmission of incident light having a specific range of wavelengths is the characteristic of the filter. The spectrum of the transmitted light can be determined using a spectrometer. The measured value of the spectrum obtained by using the spectrometer is used for calculating the reference amount of measured light. In this context, the phrase "reference amount of measured light" is the reference value of the amount of light that needs to be present when measured by the optical film thickness meter 10 before the control unit 12 will acknowledge that the thickness of the thin film has reached the desired, predetermined thickness. However, to facilitate this calculation by approximation, the measured value of the spectrum may be replaced with a normal distribution function described in the following equation:

$$T_{filter}(\lambda) = \frac{1}{\sqrt{2\pi \det \lambda}} \exp^{-\frac{(\lambda - \lambda_0)^2}{2 \det \lambda^2}} \quad (1)$$

wherein
  $\lambda$: a dispersed wavelength (nm)
  $\lambda_0$: the central wavelength (nm)
  $T_{filter}(\lambda)$: the transmission of light of $\lambda$ through the filter.

Light-receiving sensor 106 is a sensor that can accurately detect the light transmitted through the filter 105. The intensity of the light, (i.e., the amount of measured light), reaching the light-receiving sensor 106 is determined from the sum of the individual intensities of light with respect to each wavelength in the spectrum that passed through the filter 105. Pen recorder 107 is connected to receive data signals from light-receiving sensor and can provide a written graphical printout of the intensity spectrum for the transmitted wavelengths transmitted by filter 105 and measured by light-receiving sensor 106.

The main portion of thickness meter 11 converts the data signals corresponding to the intensity of light detected by the light-receiving sensor 106 into a relative number (expressed as a percentage). For example, light is projected from the light-projecting lamp 101 to the reflection mirror A 102 when no thin film has been formed on the monitor glass 2b and the amount of light detected by the light-receiving sensor 106 under this condition is set by selection of filter 105 at a desired number, such as 20% to 30% the initial value of the amount of incident light provided by the light-projecting lamp. Using this initial value as the reference amount of measured light value, the local maximum values and the local minimum values are obtained over a time period wherein change in the amount of measured light is observed during the formation of the thin film. When the initial value is used as the reference amount of measured light value as described above, the amount of measured light is preferably expressed as a relative value. In addition, the range of wavelengths being measured is restricted by the filter 105 as described above. Therefore, it is practical to collect data corresponding to the reference amount of measured light value without the need to measure the spectrum of radiation intensity generated by the light-projecting lamp 101.

Figure 5:
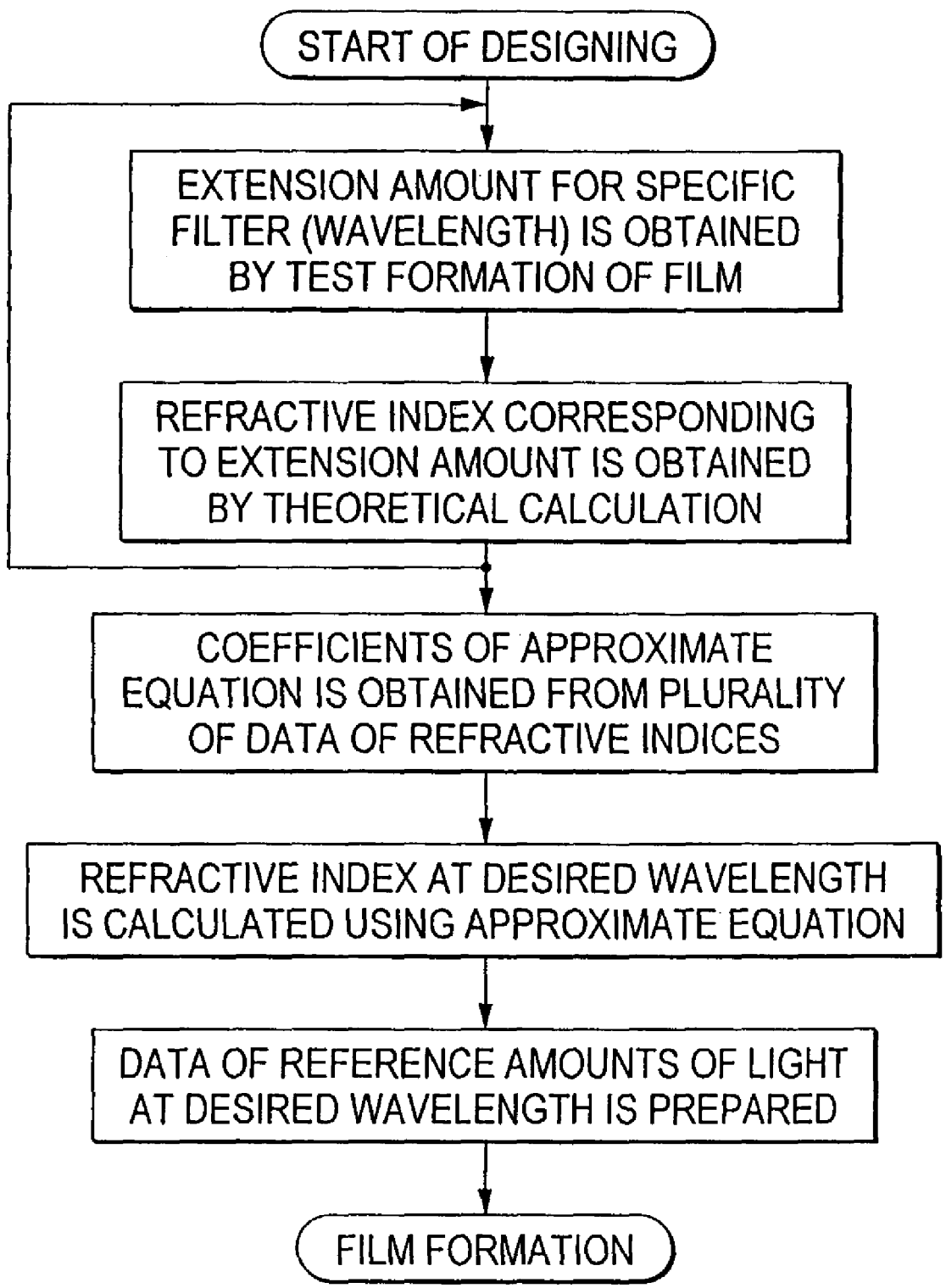
FIG. 5 is a flow diagram exhibiting the procedural steps used for obtaining the curve describing the dependency of the refractive index of the thin film on the wavelength in the stage of designing the thin film.

In the present embodiment of the invention, the reference amount of measured light is obtained by conducting a test vapor deposition during the stage of designing the desired thin film. The curve describing the dependency of the refractive index of the thin film on the wavelength is empirically obtained by conventional measurement, and the reference amount of measured light is theoretically calculated using the curve thus obtained describing refractive index as a function of wavelength. The procedural steps in the method for determining the curve describing the dependency of refractive index of the thin film as a function of wavelength is described in more detail as follows. FIG. 5 is a flow diagram exhibiting the procedural steps for obtaining the curve describing the dependency of the refractive index of the thin film on the wavelength as is determined in the stage of designing the thin film and used in the procedures for forming the thin film. Thus, the curve describing the dependency of the refractive index of the thin film on the wavelength is obtained in accordance with the procedures shown in FIG. 5.

Step (1): Start of Designing

The optical design of the thin film to be formed by the film formation techniques described above is conducted first. For example, it is assumed that the thin film to be formed in accordance with the present invention is an antireflection film formed on the surface of a spectacle lens, wherein the antireflection film is a film having a simple structure in which films having a high refractive index and films having a low refractive index are laminated alternately. When designing the laminated antireflection film, the refractive indices for each film in the laminate, the thickness of each film in the laminate, and the number of films in the laminate are decided in accordance with the desired range of wavelengths of light that the antireflection film is constructed to prevent reflection thereof, the desired antireflection property of the antireflection film, the desired color of the reflected light, and like other factors.

Step (2): Test Vapor Deposition

The above designing step is conducted for the antireflection film that is to be formed on the surface of the spectacle lens. However, thin film formation is not controlled by directly measuring reflection of light using the antireflection film formed on the spectacle lens itself, but indirectly by measuring the reflection of light from a thin film formed on the monitor glass $2b$. The reason for using the thin film formed on the monitor glass and not the thin film formed on the surface of one of the lenses $2a$ is that the smoothness and accuracy of the surface of the monitor glass can be kept constant. This is partly because the monitor glass is made of an inorganic material, such as glass, and partly because the monitor glass has a flat surface. In contrast, lenses $2a$ may be made of glass, or of an organic material such as plastic. Consequently, the smoothness and accuracy of the surface of the various spectacle lenses $2a$, depending upon whether they are made of glass or plastic, are different among the varied types of spectacle lenses. Since most spectacle lenses $2a$ are made of an organic material, (i.e., plastic) and because most lenses have a curved surface, it is easier for the optical film thickness meter 10 to measure the thickness of the thin film on the flat surface of the monitor glass $2b$ than it is for the optical film thickness meter to measure the thickness of the thin film on the curved surface of a spectacle lens $2a$. Thus, a test vapor deposition is conducted to deposit the substance $4a$ for vapor deposition on the monitor glass $2b$ based on the values of the various design parameters decided in the designing step for the purpose of making any necessary adjustments to the vapor deposition apparatus before exposing many lenses to the thin film formation process.

In the test vapor deposition step, test thin film formation is conducted on the surfaces of a spectacle lens and the monitor glass. The thin films are formed simultaneously on the spectacle glass and the monitor glass under controlled conditions so that the thin film formed on the spectacle lens is provided to have the specifically decided parameter values chosen during the design step. Specifically, after the spectacle lens has had the thin film deposited thereon, the spectacle lens is taken out of the vacuum chamber of the vapor deposition apparatus and brought into the atmospheric environment; however, the amount of light reflected from the monitor glass $2b$ during the film formation is measured using an optical film thickness meter. The measurement of light reflected by the monitor glass during the thin film formation is conducted using a preselected filter for a specific wavelength in the optical film thickness meter so that the amount of light measured has a specific wavelength. Furthermore, a plurality of test vapor deposition steps are conducted using various other preselected filters in the optical film thickness meter 10, wherein each preselected filter transmits light having a different wavelength from the other preselected filters so that the amount of measured light is determined for each filter so that the extension amount for each wavelength is determined from the collected data.

Step (3): Obtaining the Refractive Index of the Thin Film at Each Wavelength

The amount of light measured by the optical film thickness meter can be theoretically calculated when certain constants of apparatuses, such as the intensity of the light source, the optical characteristics of the reflection mirrors, the wavelengths of the filters and the light-receiving sensor, and factors characteristic of the film formation such as the reflectivity at the surface of the monitor glass, are known. When the actual physical conditions of film formation and the actually used optical film thickness meter are considered, the constants of the vapor deposition apparatuses can be obtained relatively easily. In many cases, the factors characteristic in the thin film formation, such as the refractive index of the monitor glass itself, are known. Therefore, the amount of light measured by the optical film thickness meter can be theoretically calculated relatively easily. The factor which remains unknown in the theoretical calculation is the refractive index of the film formed on the surface of the monitor glass. When factors other than the refractive index of the formed film are known, the remaining factor,(i.e., the refractive index of the thin film at various wavelengths), can be determined by measuring the amount of light for each filter as described above.

In view of the theory for the determination of the refractive index of the thin film at the wavelengths described above, the optical thickness of the thin film, when the reflectivity shows local maximum and local minimum value characteristics during the time period of the film formation on the monitor glass $2b$, can be obtained by theoretical calculation. When the local maximum amount of measured light and the local minimum amount of measured light are known, the extension amount described above can be determined. Since the optical film thickness meter 10 uses a filter 105, the local maximum amount of measured light and the local minimum amount of measured light are values at the wavelength transmitted through the particular filter 105 used. When the optical thickness of the thin film deposited upon and providing the monitor glass $2b$ with the local maximum of the reflectivity is known, then the refractive index of the thin film at the wavelength of light transmitted through the filter 105 can be determined. The above descriptions will be further illuminated with reference to simplified equations as follows.

When the following factors are represented as follows:

(r)=the reflectivity of the monitor glass having the thin film

L=the optical thickness of the thin film d=the physical thickness of the thin film n=the refractive index of the thin film the relations between these factors are expressed by the following simplified general equations:

$$\Delta = \Delta(n,d) \tag{i}$$

$$L = L(n,d) \tag{ii}$$

wherein Δ represents the difference in the reflectivity.

When the optical thickness (L) of the thin film at the local maximum amount of measured light described above, and the difference in the reflectivity (Δ) corresponding to the optical thickness, are substituted into above equations (i) and (ii), the refractive index of the thin film n can be calculated. When the refractive index and the optical thickness of the thin film are substituted into equation (ii), the physical thickness of the thin film can be calculated.

Next, it will be described in the following that the reflectivity, the refractive index of the thin film, and the amount of measured light have a relation among each other. The amount of measured light Q(t) (%) detected at a time t by the light-receiving sensor 106 of the optical film thickness meter 10 can be expressed by the following equation:

$$Q(t) = \left\{ \frac{\sum_{\lambda=380}^{780} P(\lambda,t)}{\sum_{\lambda=380}^{780} P(\lambda,0)} \right\} \cdot Q_0 \qquad (2)$$

In the above equation, it is assumed that the following conditions are satisfied:

(a) Q0 represents the initially set amount of light.

(b) $P(\lambda,t)$=Rmonitor(d1, d2, ..., dk(t), n0($\lambda$), n1($\lambda$), n2($\lambda$), ..., nk($\lambda$)).

$$T(\lambda) \cdot X(\lambda) \qquad (3)$$

(c) P represents the absolute amount of light.

(d) $T(\lambda)$ represents the transmittance through the filter 105, $X(\lambda)$ represents functions depending on the optical members constituting the film thickness meter 10 such as the intensity function ($S(\lambda)$) of the light-projecting lamp 101 and the reflectivities (Rmirror($\lambda$)) of the reflection mirrors 102 and 104. In general, these factors can be used as constants for the vapor deposition apparatuses.

(e) R represents the reflectivity of the monitor glass and can be obtained by a well known optical calculation such as the calculation using the following equation (4). The factors are the refractive index of the glass n0($\lambda$), the thicknesses of layers d1, d2, ..., d(t) and the refractive indices of layers n1($\lambda$), n2($\lambda$), ..., n($\lambda$) when the entire film is composed of k layers. d alone is a function of t.

$$\text{Rmonitor}(\lambda) = \{R1(\lambda)(1-R2(\lambda)) + R2(\lambda)(1-R1(\lambda))\}/\{1-R1(\lambda) \cdot R2(\lambda)\} \qquad (4)$$

(f) In the above equation (4), $R1(\lambda)$ represents the reflectivity at the surface (the upper surface) of the monitor glass 2b and $R2(\lambda)$ represents the reflectivity at the back surface (the lower surface) of the monitor glass.

The reflectivity $R1(\lambda)$ at the upper surface of the monitor glass 2b can be obtained when the refractive index of the monitor glass is known. In contrast, the reflectivity $R2(\lambda)$ at the back lower surface of the monitor glass 2b depends on the thin film formed on the back surface of the monitor glass. When the thin film formed on the back surface of the monitor glass 2b is a multi-layer film constituted with a plurality of layers, the relations can be expressed as described in the following.

When each layer in the multi-layer thin film is a uniform film, or can be divided into uniform films, each layer can be expressed by the following four-element matrix having two rows and two columns:

$$M = \begin{pmatrix} \cos g & iu^{-1} \sin g \\ iu \sin g & \cos g \end{pmatrix} \qquad (5)$$

wherein
g=$(2\pi/\lambda) \cdot n(\lambda) d(t) \cdot \cos \phi$
u=$n(\lambda) \cos \phi$ (s-polarized)
  $n(\lambda) \sec \phi$ (p-polarized)
$\lambda$: the wavelength of light
$n(\lambda)$: the refractive index of the film at a wavelength $\lambda$
d(t): the thickness of the film at a time expressed by second
$\phi$: the incident angle of light into the film The multi-layer film having k layers which is formed on the surface of the monitor glass is expressed by the product of characteristic matrices (four-element matrices) for each layer. The characteristic matrix M is expressed by the following equation (6):

$$M = \begin{pmatrix} m_{11} & im_{12} \\ im_{21} & m_{22} \end{pmatrix} \qquad (6)$$

$$= \prod_{j=1}^{k} Mj$$

From the characteristic matrix M, the amplitude of reflectivity $r(\lambda)$ of the multi-layer thin film can be expressed as:

$$r(\lambda) = \frac{(m_{11} + im_{12}u_s)u_0 - (im_{21} + m_{22}u_s)}{(m_{11} + im_{12}u_s)u_0 + (im_{21} + m_{22}u_s)} \qquad (7)$$

wherein
$u_0 = n_0 \cos \phi_0$ (s-polarized)
  $n_0 \sec \phi_0$ (p-polarized)
$u_s = n_s \cos \phi_s$ (s-polarized)
  $n_s \sec \phi_s$ (p-polarized)
$n_0$: the refractive index of a medium (vacuum)
$\phi_0$: the incident angle of light into the film
$n_s$: the refractive index of the monitor glass
$\phi_s$: the incident angle of light into the next film The energy of reflectivity $R1(\lambda)$ is expressed as:

$$R1(\lambda) = |r(\lambda)|^2 \qquad (8)$$

As clearly shown by equations (2) to (8), the amount of light Q(t) measured by the optical film thickness meter is a function of the refractive index of the monitor glass $R(\lambda)$ and the refractive index of the thin film $n(\lambda)$. $T(\lambda)$, $X(\lambda)$, d(t), the refractive index of the monitor glass n, the incident angle into the film $\phi$ and the wavelength $\lambda$ can be determined or set as constants. In summary, these series of equations can be used to determine the refractive index corresponding to the extension amount by theoretical calculation.

Step (4): Obtaining an approximate curve exhibiting the relation between the refractive index of the thin film and the wavelength.

Figure 7:
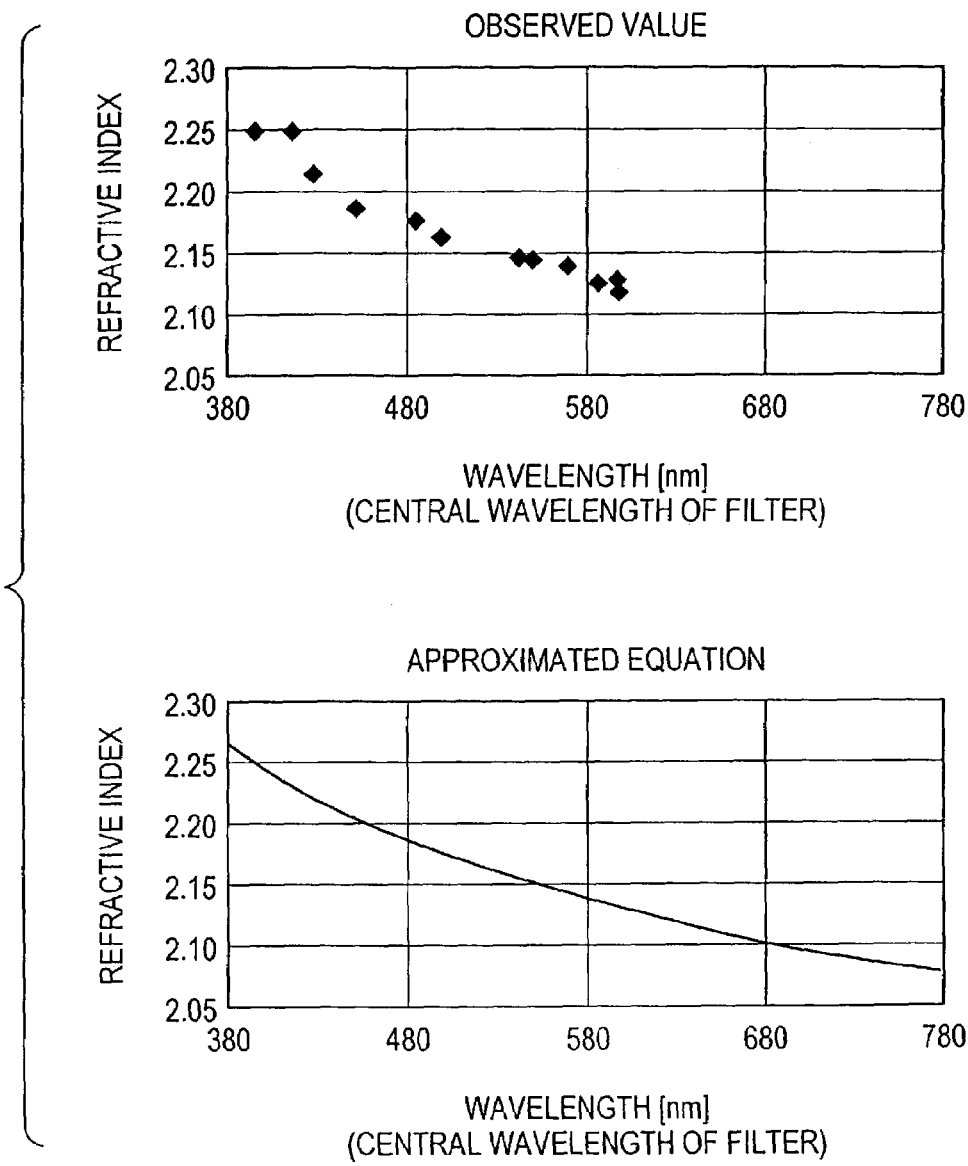
FIG. 7 is a split diagram exhibiting the plot of observed refractive indices of the thin film plotted at a plurality of wavelengths and compares this plot to another plot exhibiting a theoretical curve expressed by the equation in which the constants Na, Nb and Nc are obtained by substituting the measured values into the equation.

FIG. 6 provides a table exhibiting the extension amounts at a plurality of wavelengths obtained in step (3) described above and the refractive indices corresponding to these extension amounts. As shown in FIG. 6, when the refractive indices of the thin film at a plurality of wavelengths are obtained, the characteristic curve approximately exhibiting the dependency of the refractive index of the thin film on the wavelength can be determined. In other words, when the refractive index of the thin film at the wavelength $\lambda$ is represented by $N(\lambda)$, the characteristic curve can be approximately expressed as $N(\lambda)=Na+Nb/(\lambda+Nc)$, wherein Na, Nb and Nc represent refractive index coefficients characteristic for the substance 4a used for vapor deposition. FIG. 7 provides a split-diagram comparing refractive indices determined by measurement and by calculation, respectively, using an approximated equation, wherein the top diagram exhibits a curve of the measured refractive indices of the thin film at a plurality of wavelengths and the bottom diagram exhibits a curve expressed by the above approximated equation in which the constants Na, Nb and Nc are obtained by substituting the measured values into the above equation. In other words, the coefficients of the approximate equation are obtained from measured data of the refractive indices as a function of wavelength.

Step (5): Calculation of the refractive index of the thin film at a desired wavelength Using the equation describing the characteristic curve approximately exhibiting the dependency of the refractive index of the thin film on the wavelength obtained in step (4), the refractive index at a desired wavelength is calculated.

Step (6): Preparation of data of the reference amount of measured light of the thin film at the desired wavelength When the refractive index and the physical thickness of the thin film to be formed at the desired wavelength are known, the reflectivity at the monitor glass 2b as measured by the optical film thickness meter 10 can be determined. Therefore, the amount of measured light can be measured continuously during the film formation. The change in the reference amount of measured light can be calculated by differentiating the measured reference amount of measured light. The reference amount of measured light thus obtained is stored as the amount of light $1(\%)$ that would be measured by the optical film thickness meter 10 at a reference time t (second). The reference amount of measured light is stored in the "means for storing the data of the reference amount of light" 13 in the form of paired data including (a) the time, and (b) the amount of light, corresponding to the reference amount of measured light.

In the actual production of spectacles with thin antireflection films thereon, when the color of the reflected light (i.e, the interference color) of a thin film formed based upon the reference amount of measured light, or the change in the reference amount of measured light obtained by theoretical calculation, is visually examined, the obtained color is occasionally somewhat different from the desired color of the reflected light (i.e., the interference color). When this occurs, the wavelength set for use in the calculation is modified to some degree and the refractive index of the thin film at this modified wavelength is determined from the characteristic curve, such as shown in FIG. 7, exhibiting the dependency of the refractive index of the thin film on the wavelength. Using the refractive index of the thin film at the modified wavelength, the reference amount of measured light, or the change in the reference amount of measured light, is obtained by theoretical calculation. By forming the film based on the reference amount of measured light, or on the change in the reference amount of measured light calculated above, the thin film having the desired color of the reflected light (i.e., the interference color) can be produced relatively easily and reliably.

Sometimes it is found during the setting of the desired color, (i.e., the interference color), that the selection of the filter 105 in the optical film thickness meter 10 is not suitable to produce a thin film to reflect the desired color. In these cases, the filter 105 is replaced with a filter suitable for producing thin films reflecting the desired color. Then data corresponding to the reference amount of measured light for the new suitable filter, which replaces the current unsuitable filter, can be easily prepared using the above theoretical calculation. When the number of different types of the antireflection films are great in the actual manufacturing production line, the type of filter 105 used in the optical film thickness meter 10 may be different among the individual vapor deposition apparatuses. In this case, the refractive index of the thin film at the wavelength of light transmitted by the particular filter currently in use is determined from the corresponding characteristic curve exhibiting the dependency of the refractive index of the thin film on the wavelength and the modified reference amount of measured light, or the modified change in the reference amount of measured light, as is obtained by theoretical calculation. The film formation can be conducted using the modified reference amount of measured light, or the modified change in the reference amount of measured light, thus calculated. Therefore, when the current filter 105 of the optical film thickness meter 10 is replaced with another filter, the reference amount of measured light, or the change in the reference amount of measured light, is easily calculated and the film formation can be conducted reliably using the reference amount of measured light, or the change in the reference amount of measured light, thus calculated.

In accordance with the above description, a method for selecting the filter 105 that transmits the incident reflected light is one example of a method for selecting the wavelength used in the optical film thickness meter 10. However, other equivalent methods for selecting the wavelength used in the optical film thickness meter 10 can be used without departing from the scope and spirit of the present invention. For example, another method for selecting the wavelength used in the optical film thickness meter 10, is to place a filter between the light-projecting lamp 101 and the glass monitor 2b. In this alternate method for selecting the wavelength, the filter transmits only light of a certain wavelength from the light projected by the light-projecting lamp 101 so the thin film is irradiated only with the light transmitted through the filter. In this method, as in the previously described method, the wavelength may be changed by changing the filter to one having a different wavelength transmission characteristic. As still another method for selecting the wavelength used in the optical film thickness meter, a lamp projecting a prescribed specific light of a certain wavelength may be used as the light-projecting lamp, and a plurality of such lamps which project light of different wavelengths may be exchanged as needed or used in different vapor deposition apparatuses. Thus, the wavelength may be changed by changing the light-projecting lamp itself. In the alternate methods for selecting the wavelength used in the optical film thickness meter described above, and as in the method for obtaining the reference amount of measured light, a plurality of the refractive indices are obtained using the test formation of films step. From the measured data, the equation describing the relationship between the wavelength and the refractive index is determined based upon the plurality of the refractive indices thus measured. The refractive index at a desired wavelength is calculated using the determined equation, and the data corresponding to the reference amount of measured light at the desired wavelength is calculated by substituting the determined refractive index into the equation expressing the theoretical amount of measured light.

However, the data of the reference amount of measured light at the wavelength used in the test formation of the film have already been determined in the test formation of the film. In other words, at a plurality of wavelengths, the data needed for determining the reference amount of measured light have already been determined during the test formation of the film. Therefore, using the data of the reference amount of measured light at these wavelengths, the data corresponding to the reference amount of measured light at wavelengths that have not been tested can be determined in accordance with the interpolation method of the present invention or by some other like method. As yet another method for selecting the wavelength used in an optical film thickness meter, for example, when the data of the reference amount of measured light measured during the test formation of the film are shown as curves in a graph, the point of the reference amount of measured light at another wavelength may be extrapolated between the plurality of the previously obtained points. The point of the reference amount of measured light at a desired wavelength may be determined by extrapolatingg the curve from the other known data points or portions of the curve in accordance with the interpolation method or other like method.

Step (7): Process for Forming the Thin Film

The process for forming the thin film of the present embodiment of the invention will be described specifically as follows. The control of a process for forming a thin film by using an optical film thickness meter 10 and by using the reference amount of measured light, or the change in the reference amount of measured light, has been known as described in Japanese Patent Application Laid-Open Nos. 2001-115260 and 2001-123269 and European Patent Application Laid-Open No. 1094344.

In the process for forming a thin film in accordance with the present invention, the coat dome 2, the lenses 2a, being the articles for forming a thin film thereon, and the monitor glass 2b, are set into position and the material of vapor deposition 4a is placed into the crucible 4. Then, the vacuum chamber 1 is evacuated to a prescribed degree of vacuum and the lenses 2a are heated at a prescribed temperature by the halogen heater 9. Thereafter, the control of electric power applied to the electron gun 3 is started so that the vapor deposition process can be started.

The formation of the thin film by the vapor deposition technique starts when the shutter 5 opens. Therefore, the time is set at 0 when the shutter 5 is first opened to start the vapor deposition process and the time passed thereafter is expressed by t (second). In general, when the shutter 5 is opened, the amount of measured light received by the optical film thickness meter 10 begins to change. However, in actuality, the beginning of the change in the amount of measured light is occasionally delayed. In this case, it may be necessary to apply a prescribed electric power to the electron gun 3 after a prescribed time has passed so that the vapor deposition control can begin.

The film formation is conducted under the software control by the computer, (i.e., computing apparatus), or computing portion of the control unit 12. The reference amount of measured light stored in the means 13 for storing the reference amount of measured light is read out, compared with the amount of light actually measured by the optical film thickness meter, and the electric current of the electron gun 3 is adjusted until these measured and reference amounts of measured light agree with each other. In other words, when the value of the measured amount of measured light is identical, or nearly identical, to the value of the reference amount of measured light, then the control unit 12 operates to discontinue electric power to the electric gun 3 and conclude the vapor deposition process.

The control of the electric current of the electron gun 3 is conducted, for example, in the following manner. When the amount of measured light (the value obtained by the measurement) at a time $t_{i-1}$ (the actual time) from the time when the shutter is opened is expressed as $I_{i-1}$, then the reference amount of measured light $I_S$, which is the same as $I_{i-1}$ ($I_S=I_{i-1}$), is retrieved from the reference data. In this context, "i" means that this operation is the i-th control. When the value which is the same as $I_{i-1}$ is not found, an approximate value is calculated. Then, the time $t_S$ (the reference time) corresponding to this reference amount of measured light $I_S$ is calculated from the reference data.

The amount of measured light, (i.e., the value obtained by the measurement=the actual amount of light), corresponding to the time $t_i$, which is some time after the actual time $t_{i-1}$ by a control interval $\Delta t$ (second), is expressed by $I_i$. Separately, the reference amount of measured light $I_{S'}$ corresponding to the reference time $t_{S'}$ ($=t_S+\Delta t$) is obtained from the reference data.

$\Delta I_i$ and $\Delta I_{Si}$ are defined as follows:

$$\Delta I_i = I_i - I_{i-1}$$

$$\Delta I_{Si} = I_{S'} - I_S$$

and $R_i$ is defined as follows:

$$R_i = I - \Delta I_i / \Delta I_{Si}$$

or $$R_i = (I_{S'} - I_i)/(I_{S'} - I_S)$$

Figure 8:
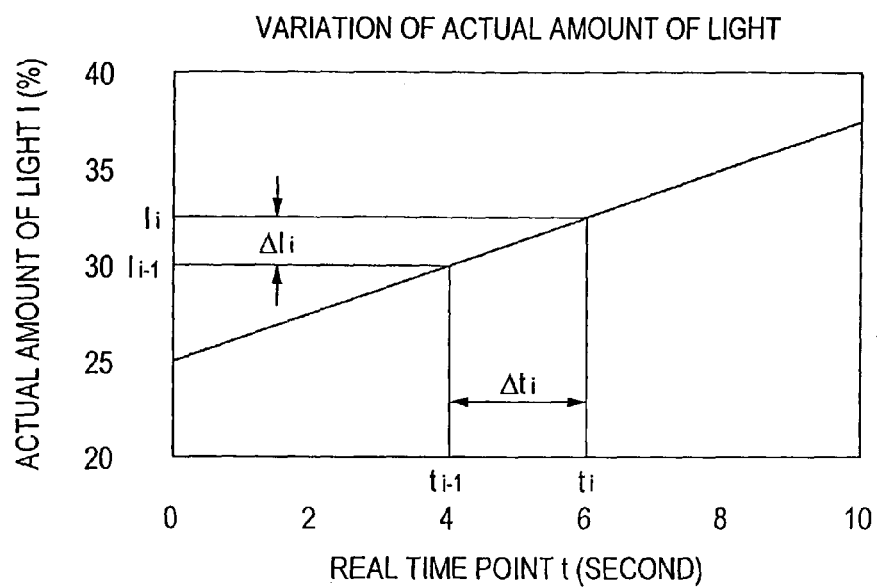
FIG. 8 is a split-diagram exhibiting a plot of the change in the actual amount of light and a exhibiting a plot of the change in the reference amount of light.
Figure 8:
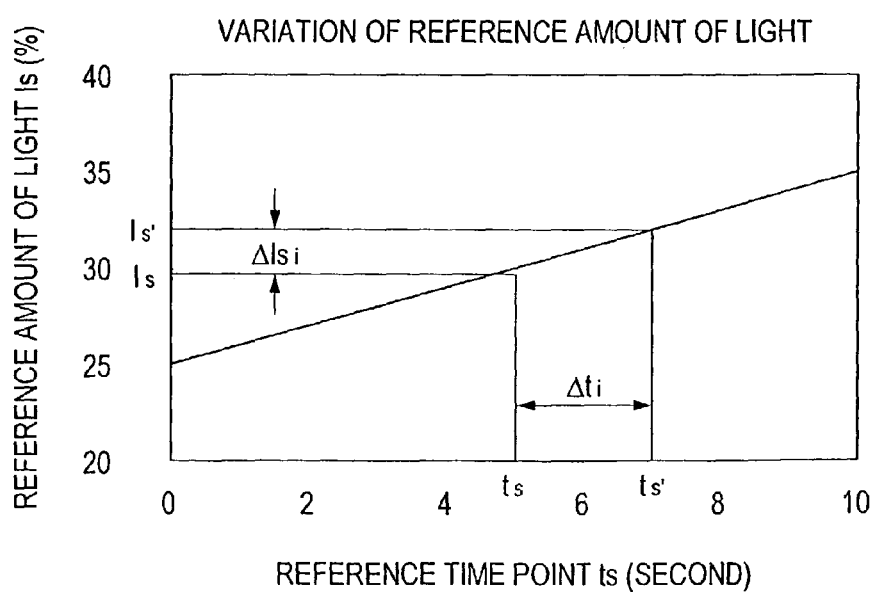

FIG. 8 provides a diagram exhibiting the change in the actual amount of light and a diagram exhibiting the change in the reference amount of light.

$R_i$ is further converted as follows:

$$Q_i = kR_i|R_i|$$

wherein k represents an arbitrary constant. Using $Q_i$ shown above, the PID control (the control of proportion, integration and differentiation) is conducted and the power of the electron gun $P_i$ is decided at a desired time. The equation for the PID control deciding the value of the power of the electron gun $P_i$ is shown as follows:

$$P_i = P_{i-1} + Kp \cdot Q_i + Ki \cdot \Sigma Q_i + Kd \cdot det\ Q_i$$

wherein Kp, Ki and Kd each represent an arbitrary constant.

$\Sigma Q_i$ is expressed as follows:

$$\Sigma Qi = \int_{i-1}^{ti} Q(t)dt \qquad (9)$$

$$det\ Q_i = Q_i - Q_{i-1} \qquad (10)$$

The above PID control is conducted at intervals of the control interval $\Delta t_i$ (second). The control interval $\Delta t$ (second) is changed in accordance with the degree of agreement (R). In general, when the degree of agreement is greater (the value of R is closer to 0), the control interval $\Delta t$ is set at a greater value. It is also possible that the PID control (the control of proportion, integration and differentiation) is conducted using R and the power of electron gun $P_i$ is decided at a desired time.

As described in detail above and in accordance with the present invention, the desired film formation is conducted while the amount of interfering light reflected by the thin film and the surface of the glass monitor 2b is continuously measured by the optical film thickness meter 10 during the film formation. The conditions of the film formation are controlled so that the amount of light obtained by measurement agrees with the reference amount of measured light. The reference amount of measured light in the above procedure is obtained as follows: (a) the refractive index is determined at a plurality of wavelengths by theoretical calculation using the amount of measured light obtained by actual measurement in the test formation step of a test film deposited after the designing stage; (b) the relationship between the wavelength and the refractive index of the formed thin test film is determined from the plurality of refractive indices; (c) the refractive index for the film formation at the desired wavelength is determined; and the reference amount of measured light is calculated by substituting the determined refractive index into the above theoretical equation. In accordance with the above process, the thin film having the prescribed properties at the desired wavelength can be easily formed.

While the present invention has been described with reference to certain preferred embodiments, one of ordinary skill in the art will recognize that additions, deletions, substitutions, modifications and improvements can be made while remaining within the spirit and scope of the present invention as defined by the appended claims.

What is claimed is:

1. A process for forming a thin film, comprising the steps of:
    forming a first thin film by flying and depositing a film-forming material onto a surface of an article and on a monitor glass;
    continuously measuring a thickness of the first thin film using an optical film thickness meter during formation of the first thin film; and
    continuously controlling the amount of the film-forming material in flight during the formation of the first thin film until an amount of light measured by the optical film thickness meter becomes substantially equal to a predetermined reference value for the amount of measured light, wherein prior to forming the first thin film, the process further comprises the steps of:
    conducting a test formation of a test thin film, wherein a refractive index of the formed test thin film is determined at a first plurality of wavelengths by using the optical film thickness meter; and
    calculating a first reference value for the amount of measured light at a second plurality of wavelengths from refractive indices corresponding to the first plurality of wavelengths, the refractive indices being determined from the amount of measured light or the change in the amount of measured light measured continuously by the optical film thickness meter during test formation of the test film, using a theoretical calculation so thin film formation forms the first thin film to have a controlled optical thickness at a first predetermined wavelength, and using the calculated first reference value as the predetermined reference value for the amount of measured light, wherein
    a) the optical film thickness meter is an optical thickness meter utilizing dependency on an amount of light of prescribed wavelength transmitted through, or reflected by, thin film based upon at least thin film thickness and thin film refractive index and, when the monitor glass on which the first thin film is formed is irradiated with prescribed light at the second plurality of wavelengths, the optical film thickness meter provides a measurement of the thickness of the first thin film by measuring an amount of light transmitted or reflected by the first thin film; and
    b) the optical film thickness meter continuously measures, during the formation of the first thin film, an amount of transmitted or reflected light, or a change in the amount of transmitted or reflected light, which changes with the change in the thickness of the first thin film deposited on the surface of the article.

2. A process according to claim 1, wherein the refractive index of the first thin film is calculated using measured values for at least a reflectivity of the monitor glass and a transmission spectrum of a filter of the optical film thickness meter.

3. A process for producing a lens comprising the process for forming a thin film described in claim 2 as a step, wherein the article is a lens for forming the first thin film thereon.

4. A process for producing a lens comprising the process for forming a thin film described in claim 1 as a step, wherein the article is a lens for forming the first thin film thereon.

5. A process for forming a thin film, comprising the steps of:
    forming a first thin film by flying and depositing a film-forming material onto a surface of an article and on a monitor glass;
    continuously measuring a thickness of the first thin film using an optical film thickness meter during formation of the first thin film; and
    continuously controlling the amount of the film-forming material in flight during the formation of the first thin film until an amount of light measured by the optical film thickness meter becomes substantially equal to a predetermined reference value for the amount of measured light, wherein prior to forming the first thin film, the process further comprises the steps of:
    conducting a test formation of a test thin film, wherein a refractive index of the formed test thin film is determined at a first plurality of wavelengths by using the optical film thickness meter; and
    calculating a first reference value for the amount of measured light at a second plurality of wavelengths from refractive indices corresponding to the first plurality of wavelengths, the refractive indices being determined from the amount of measured light or the change in the amount of measured light measured continuously by the optical film thickness meter during test formation of the test film, using a theoretical calculation so thin film formation forms the first thin film to have a controlled optical thickness at a first predetermined wavelength, and using the calculated first reference value as the predetermined reference value for the amount of measured light, wherein
    a) the optical film thickness meter is an optical thickness meter utilizing dependency on an amount of light of prescribed wavelength transmitted through, or reflected by, thin film based upon at least thin film thickness and thin film refractive index and, when the monitor glass on which the first thin film is formed is irradiated with prescribed light at the second plurality of wavelengths, the optical film thickness meter provides a measurement of the thickness of the first thin film by measuring an amount of light transmitted or reflected by the first thin film; and
    b) the optical film thickness meter continuously measures, during the formation of the first thin film, an amount of transmitted or reflected light, or a change in the amount of transmitted or reflected light, which changes with the change in the thickness of the first thin film deposited on the surface of the article, wherein the predetermined reference value for the amount of measured light is determined in accordance with a first sub-process comprising the steps of:

i) conducting the test formation of the test thin film while the amount of light, or the change in the amount of light, of prescribed wavelength is continuously measured by the optical film thickness meter during test film formation;

ii) forming a test thin film having a predetermined optical thickness at the prescribed wavelength and determining the refractive index of the formed test thin film at the prescribed wavelength from material constants including the optical thickness and a physical thickness of the test thin film;

iii) conducting test formation of other test thin films using light of a third plurality of wavelengths that are different from the prescribed wavelength, wherein each one of the other test thin films has the predetermined optical thickness, and a corresponding refractive index for each of the other test thin films at the respective one of the third plurality of wavelengths is determined from material constants including optical thickness and physical thickness of the respective test thin film so that the respective refractive indices of the formed other test thin films are determined at the third plurality of wavelengths;

iv) generating an equation expressing a relation between wavelength and thin film refractive index from the refractive indices of all test thin films determined at the prescribed wavelength and the third plurality of wavelengths in the test formation of all test thin films and calculating a refractive index at a second preselected wavelength different from all examined wavelengths using the equation; and v) expressing the amount of measured light or the change in the amount of measured light measured continuously during thin film formation using the optical film thickness meter by a theoretical equation that is a function of thin film refractive index determined during test film formation, calculating continuously the amount of light or the change in the amount of light of a third preselected wavelength during thin film formation by substituting a corresponding determined refractive index at the third preselected wavelength into the theoretical equation; and using the calculated amount of light or the calculated change in the amount of light as the predetermined reference value for the amount of measured light corresponding to the third preselected wavelength.

6. A process according to claim 5, wherein the refractive index of the first thin film is calculated using measured values for at least a reflectivity of the monitor glass and a transmission spectrum of a filter of the optical film thickness meter.

7. A process for producing a lens comprising the process for forming a thin film described in claim 5 as a step, wherein the article is a lens for forming the first thin film thereon.

8. A process for producing a lens comprising the process for forming a thin film described in claim 6 as a step, wherein the article is a lens for forming the first thin film thereon.

9. A process for forming a thin film, comprising the steps of:

forming a first thin film by flying and depositing a film-forming material onto a surface of an article and on a monitor glass;

continuously measuring a thickness of the first thin film using an optical film thickness meter during formation of the first thin film; and continuously controlling the amount of the film-forming material in flight during the formation of the first thin film until an amount of light measured by the optical film thickness meter becomes substantially equal to a predetermined reference value for the amount of measured light, wherein prior to forming the first thin film, the process further comprises the steps of:

conducting a test formation of a plurality of test thin films, wherein a refractive index of each of the formed test thin films is determined at a first plurality of wavelengths by using the optical film thickness meter; and calculating a first reference value for the amount of measured light at a second plurality of wavelengths from refractive indices corresponding to the first plurality of wavelengths, the refractive indices being determined from the amount of measured light or the change in the amount of measured light measured continuously by the optical film thickness meter during test formation of the test films, using a theoretical calculation so thin film formation forms the first thin film to have a controlled optical thickness at a first predetermined wavelength, and using the calculated first reference value as the predetermined reference value for the amount of measured light, wherein a) the optical film thickness meter is an optical thickness meter utilizing dependency on an amount of light of prescribed wavelength transmitted through, or reflected by, thin film based upon at least thin film thickness and thin film refractive index and, when the monitor glass on which the first thin film is formed is irradiated with prescribed light at the second plurality of wavelengths, the optical film thickness meter provides a measurement of the thickness of the first thin film by measuring an amount of light transmitted or reflected by the first thin film; and b) the optical film thickness meter continuously measures, during the formation of the first thin film, an amount of transmitted or reflected light, or a change in the amount of transmitted or reflected light, which changes with the change in the thickness of the first thin film deposited on the surface of the article.

* * * * *